(12) United States Patent
Chen et al.

(10) Patent No.: US 8,957,323 B2
(45) Date of Patent: Feb. 17, 2015

(54) ELECTRICAL CONNECTING ELEMENT HAVING NANO-TWINNED COPPER, METHOD OF FABRICATING THE SAME, AND ELECTRICAL CONNECTING STRUCTURE COMPRISING THE SAME

(71) Applicant: National Chiao Tung University, Hsinchu (TW)

(72) Inventors: Chih Chen, Hsinchu (TW); Wei-Lan Chiu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/973,900

(22) Filed: Aug. 22, 2013

(65) Prior Publication Data

US 2014/0090880 A1      Apr. 3, 2014

Related U.S. Application Data

(63) Continuation-in-part of application No. 13/829,256, filed on Mar. 14, 2013.

(30) Foreign Application Priority Data

| Oct. 5, 2012 | (TW) | ............................. 101136825 A |
| Nov. 21, 2012 | (TW) | ............................. 101143398 A |

(51) Int. Cl.
| H05K 3/02 | (2006.01) |
| H05K 1/11 | (2006.01) |
| H05K 1/09 | (2006.01) |
| H05K 3/40 | (2006.01) |

(52) U.S. Cl.
CPC ... *H05K 1/09* (2013.01); *H05K 3/40* (2013.01)
USPC .............................. 174/261; 174/257; 29/846

(58) Field of Classification Search
USPC .............................. 174/255–261; 29/846, 853
See application file for complete search history.

(56) References Cited

U.S. PATENT DOCUMENTS

2013/0302646 A1*  11/2013  Chen et al. .................... 428/674

OTHER PUBLICATIONS

H.Y. Hsiao et al., "Unidirectional Growth of Microbumps on (111)-Oriented and Nanotwinned Copper," Science, vol. 336, May 25, 2012, pp. 1007-1010.
T.C. Liu et al., "Fabrication and Characterization of (111)-Oriented and Nanotwinned Cu by Dc Electrodeposition," Crystal Growth & Design, 2012, pp. 5012-5016.

(Continued)

*Primary Examiner* — Jeremy C Norris
(74) *Attorney, Agent, or Firm* — Muncy, Geissler, Olds & Lowe, P.C.

(57) ABSTRACT

An electrical connecting element, a method of fabricating the same, and an electrical connecting structure comprising the same are disclosed. The method of fabricating the electrical connecting structure having twinned copper of the present invention comprises steps of: (A) providing a first substrate; (B) forming a nano-twinned copper layer on part of a surface of the first substrate; (C) forming a solder on the nano-twinned copper layer of the first substrate; and (D) reflowing the nano-twinned Cu layer and solder to produce a solder joint, wherein at least part of the solder reacts with the nano-twinned copper layer to produce an intermetallic compound (IMC) layer which comprises a $Cu_3Sn$ layer, This invention reduces the voids formation in the interface between the intermetallic compound and the solder, and then enhances the reliability of solder joints.

24 Claims, 10 Drawing Sheets

(56) References Cited

OTHER PUBLICATIONS

T.C. Liu et al., "Eliminate Kirkendall voids in solder reactions on nanotwinned copper," Scripta Materialia, vol. 68, 2012, pp. 241-244.
T.C. Liu et al., "Novel EBSD preparation method for Cu/Sn microbumps using a focused ion beam," Materials Characterization, vol. 74, 2012, pp. 42-48.
H.W. Lin et al., Microstructure control of unidirectional growth of $\eta$-$Cu_8Sn_5$ in microbumps on <111> oriented and nanotwinned Cu, Acta Materialia, vol. 61, 2013, pp. 4910-4919.

* cited by examiner

ELECTRICAL CONNECTING ELEMENT HAVING NANO-TWINNED COPPER, METHOD OF FABRICATING THE SAME, AND ELECTRICAL CONNECTING STRUCTURE COMPRISING THE SAME

CROSS-REFERENCE TO RELATED APPLICATIONS

This application is a continuation-in-part of U.S. application Ser. No. 13/829,256 filed Mar. 14, 2013, which is incorporated by reference. This application also claims the benefits of the Taiwan Patent Application Serial Number 101136825 filed on Oct. 5, 2012 and the Taiwan Patent Application Serial Number 101143398 filed on Nov. 21, 2012, the subject matters of which are incorporated herein by reference.

FIELD OF INVENTION

The present invention relates to a preparation method for making an electrical connecting structure having nano-twinned copper, an electrical connecting element having nano-twinned copper, and an electrical connecting structure having nano-twinned copper, particularly to a preparation method for making an electrical connecting structure having nano-twinned copper which can reduce kirkendall voids generated from copper-tin reactions, an electrical connecting element having nano-twinned copper, and an electrically connecting structure having nano-twinned copper.

DESCRIPTION OF RELATED ART

Copper is generally used in metal connecting devices (for examples, metal interconnect, under bump metallization (UBM), copper pillar (Cu pillar), or through silicon via (TSV)) because of its high electrical and thermal conductivities.

For instance, when applied in the UBM of a packaging structure, the copper metal is frequently electrically connected to other electronic elements through soldering. The electrical connecting process requires high temperature reflow soldering, as a result a reaction between copper metal and solder would form intermetallic compounds (IMCs), as well as voids that are detrimental to the operation of the elements.

Figure 1A:
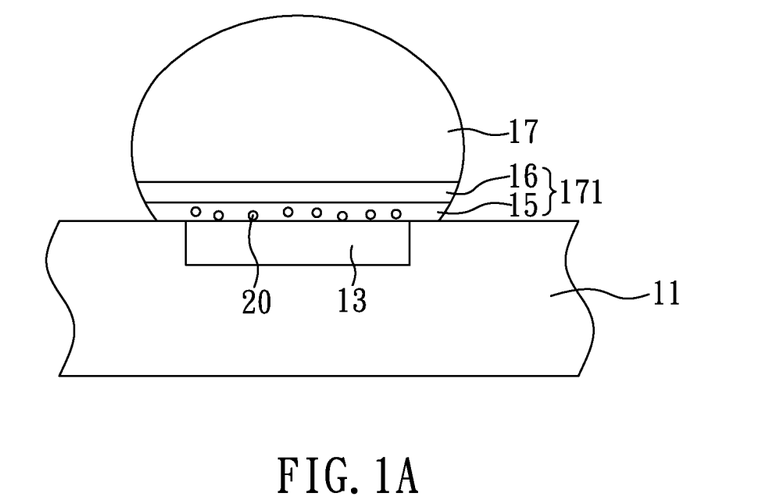
FIG 1A shows a conventional chip structure disposed with solder.

More specifically, as shown in FIG. 1A, one of the structures for the chip 11 is illustrated. This structure involves placing a solder 17 on a chip and generating an intermetallic compound during reflow soldering. In addition, this structure can further be coupled with another chip through soldering to form the structure depicted in FIG. 1B, and can also be connected to another plating carrier board or electrically connecting device. The intermetallic compound layer 171 includes a $Cu_3Sn$ layer 15 and a $Cu_6Sn_5$ layer 16, wherein the kirkendall voids 20 would be formed in the $Cu_3Sn$ layer 15, which could deteriorate the mechanical and electrical property of the electric joints and bring on other issues.

Figure 1B:
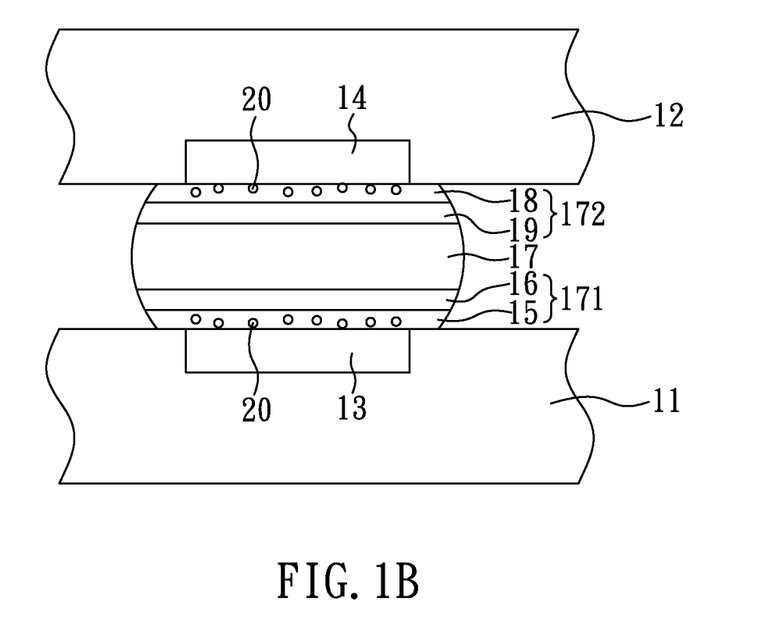
FIG. 1B shows a conventional three-dimensional integrated circuit structure (3D-IC).

In addition, as shown in FIG. 1B, for the current example in the three-dimensional integrated circuit (3D-IC) structure technology, the structure has two chips 11, 12, and each of the chips 11, 12 has an electrical pad 13, 14 (which is composed of a normal copper metal). In this illustration, the electrical pads 13, 14 are connected with each other by means of solder 17. After reflow soldering, the copper atoms of the electrical pads 13, 14 would spread over to the solder 17 and react with tin of the solder 17, to transform parts of the solder 17 into the intermetallic compound layer 171, 172 (each forming between the solder 17 and the electrical pads 13, 14). Meanwhile, the vacancies inside the solder would diffuse reversely to the interface between the intermetallic compound layers 171, 172 and the electrical pads 13, 14. Herein, each of the intermetallic compound layers 171, 172 has a $Cu_3Sn$ layer 15, 18 and a $Cu_6Sn_5$ layer 16, 19.

For the above structure, copper and tin atoms would inter-diffuse inside the joints under high temperature storage testing (e.x. 150° C., 72 hours) and/or under prolonged operation at a working temperature. The kirkendall-effect induced migration of vacancies inside the intermetallic compound toward the copper terminal results in the phenomena that vacancy concentration of lattice interface gradually increases and surpasses an equilibrium concentration. When the nucleation concentration is reached, voids would grow and could increase in size, as shown by the kirkendall voids 20 in FIG. 1. Upon the number and volume of the voids are increased to a certain level, the mechanical property of the electric joints would start to decline, making itself susceptible to cracking under an external applied force, and subsequently causing element's function failure. With regards to other information on kirkendall voids, the paper, Zeng et al. J. Appl. Phys. 97, 024508 (2005), is suggested for reference. Besides, relevant solutions have been advanced by United States Patent Publication No. U.S. Pat. Nos. 6,867,503, 7,267,861, 5,665,639, and 7,847,398, but results have fallen short of satisfaction. Specifically, shortcomings come from the requirements for barrier materials and high temperature processing, undesirable reliability, or complicated way to control preparation parameters, and etc. As a result, there is a continued demand for novel structures or materials in this technology field to resolve the via generation issue with respect to the aforementioned generation mechanism, while maintaining sound reliability, simple manufacturing method, low cost for preparation, easy-to-control preparation parameters, and other advantages.

SUMMARY OF THE INVENTION

Heretofore, the present invention provides a preparation method for making an electrical connecting structure having nano-twinned copper, comprising the steps of: (A) providing a first substrate; (B) forming a nano-twinned copper layer on a portion of a surface of the first substrate; (C) adhering a solder on a surface of the nano-twinned copper layer; (D) reflowing to connect the solder with the nano-twinned copper layer to form an electrical connecting element, wherein an intermetallic compound layer is formed from transformation of at least a portion of the solder, and the intermetallic compound layer includes a $Cu_3Sn$ layer. In this case, the electrical connecting element can be used in connecting the nano-twinned copper layer of the substrate to another device. Also, the temperature, time, and other conditions for carrying out reflow soldering are similar to the conditions for regular packaging process, and are not particularly restricted. Therefore, the present invention can be applied directly in industrial production.

The temperature for reflowing solder is associated to the melting point of the solder and can be between 100° C. and 800° C. The melting point of eutectic tin-lead solder (e.g. 183° C.) is lower than that of lead-free solder. Therefore, a lower temperature is required for reflow soldering when the eutectic tin-lead solder is used. However, when the lead-free solder is used, the temperature for reflow soldering will need to be increased. As well, the running time for the reflow soldering can be between 0.01 hours and 48 hours, and preferably between 0.01 hours and 24 hours, which can vary depending on different situations.

In the present invention, the electrical connecting structure having nano-twinned copper can be used in a chip, a circuit board, a packaging structure, or chip stacking (e.g. three-dimensional integrated circuit (3D-IC)), and other electrical elements. For example, the chip fresh from the manufacturing factory can have the electric joint of the present invention on its electrical pad so as to provide downstream companies a means to subsequently connect the chip with a substrate or a chip. Alternatively, when the three-dimensional integrated circuit has been made, the electrical connecting structure of the present invention can be used to provide an electrical connection for chip-to-chip or chip-to-electrical device.

In the method for preparing the electrical connecting structure having nano-twinned copper for the present invention, a specific material of a nano-twinned copper layer is formed on a substrate (e.g. semiconductor chip or circuit substrate, etc.) to function as an electrical connecting medium. This nano-twinned copper structure is rich of vacancy sinks, and can absorb vacancy that is diffused to the interface as a result of the kirkendall effect to make voids less possible to nucleate and precipitate. The kirkendall void between the nano-twinned copper layer and solder can be eliminated due to use of this material. With the current invention, element reliability and service life are increased due to lowered chance of joint (e.g. solder joint) cracking, and at the same time the high electrical conductivity and high heat dissipation of the copper are maintained. Therefore, the technology of the present invention can be applied in, for example flip chip, ball grid array (BGA), wafer level chip scale packaging (WLCSP), and other packing techniques commonly derived from IBM C4 technique, especially those components with high frequency and high power.

In the present invention, the preparation method of the electrical connecting structure having nano-twinned copper can further comprise a step (E) after step (D): performing solid aging to the electrical connecting element. The temperature for the solid aging can range from 100° C. to 800° C., preferably from 100° C. to 675° C., more preferably from 250° C. to 400° C., and yet more preferably from 260° C. to 450° C. The operating time thereof can be in a range from 0.01 hours to 2000 hours, preferably from 0.01 hours to 50 hours, and more preferably from 0.01 hours and 24 hours. The operating temperature for the solid aging is determined by the melting point of the solder material. Since it is desired to avoid melting the solder material while solid aging is underway, the temperature to be used needs to be lower than the melting point of the solder material.

In the present invention, the preparation method of the electrical connecting structure having nano-twinned copper can further comprise a step (D0) before the step (D): connecting a second substrate with the first substrate using the solder; or, the method can further comprise a step (D1) after the step (D): connecting a second substrate and the first substrate using the solder material, and performing another round of reflow.

The method for forming the nano-twinned copper layer of step (B) of the preparation method can be selected from the group consisting of: direct current electroplating, pulse electroplating, physical vapor deposition, vapor chemical vapor deposition and copper foil etching. It is more preferred to be direct current electroplating or pulse electroplating, and most preferred to be direct current electroplating.

For example, when electroplating is used to prepare the nano-twinned copper layer, it can comprise the steps of: (A) providing an electroplating device, wherein the device comprises an anode, a cathode (e.g. a substrate pending to be electroplated), an electroplating solution, and an electrical power supply source, the electrical power supply source is connected respectively to the anode and the cathode, and the anode and the cathode are immersed in the electroplating solution; and (B) growing a nano-twinned copper layer on a surface of the cathode by electroplating with electrical power from the electrical power supply source. The electrical power supply source is preferred to be a direct current electroplating supply source, or high speed pulse electroplating supply source, or a combination of direct current electroplating and high speed pulse electroplating, which can increase the formation rate of the twinned metal layer. When direct current electroplating supply source is used in the step (B), current density is preferred to be 1 ASD-12 ASD, most preferred to be 2 ASD-10 ASD (e.g. 8ASD). When high speed pulse electroplating supply source is used in step (B), the operating condition is preferred to be: $T_{on}/T_{off}$ (see) being 0.1/2 to 0.1/0/5 (e.g. 0.1/2, 0.1/1, or 0.1/0.5), current density being 1-25 ASD (most preferred as 5 ASD). If electroplating is executed under these conditions, the growth rate of the nano-twinned copper is calculated by actual power-on time, which is preferred to be 0.22 μm/min-2.64 μm/min. For example, when the current is 8 ASD for the electroplating in step (B), the growth rate for the twinned metal can be 1.5 μm/min-2 μm/min (e.g. 1.76 μm/min). In the current invention, the thickness of the nano-twinned copper metal layer can vary depending on the electroplating time length, whose range is preferred to be about 0.1 μm-500 μm, more preferred to be 0.8 μm -200 μm, and even more preferred to be 1-20 μm.

In the preparation method for making the electrical connecting structure having nano-twinned copper for the current invention, when step (B) uses electroplating to form the nano-twinned copper layer, the electroplating solution for the electroplating preferably comprises: a copper salt, an acid, and a chloride ion source. For the above electroplating solution, the main function of the chloride ion is to fine tune the growth direction of grains, to make twinned metal have preferred orientation. In addition, the acid can be an organic or inorganic acid, so as to increase electrolyte concentration and therefore increase electroplating speed. For example, sulfuric acid, methyl sulfonic acid, or a mixture thereof may be used. Besides, the acid concentration in the electroplating solution is preferred to be 80-120 g/L. Furthermore, the electroplating solution needs to also comprise copper ion source (that is, copper salt, for instance, copper sulfate or copper methanesulfonate). The preferred component for the electroplating solution can further comprise an additive selected from the group consisting of: gelatin, surfactant, lattice modification agent, and a combination thereof. Accordingly, the growth direction of grains can be fine-tuned by adjusting these additives.

In the preparation method for the electrical connecting structure having nano-twinned copper for the present invention, the first substrate is preferred to comprise a first electrical pad, and the first electrical pad comprises the first nano-twinned copper layer (that is, the first nano-twinned copper layer can be used as a part or a whole of the first electrical pad).

The ratio of the solder transformed into the intermetallic compound layer would vary depending on the reflow temperature, time, and the amount of solder. Therefore, under certain circumstances, the solder would partially transform into the intermetallic compound layer; under certain circumstances, the solder would completely transform into the intermetallic compound layer. In accordance with one aspect of the present invention, solder can completely transform into a $Cu_3Sn$-dominant intermetallic compound layer, and its thickness is preferred to be between 0.1-200 μm, more preferred to be between 0.1-10 μm, which is not particularly restricted. Under preferred circumstances, the thickness ratio between the intermetallic compound layer and the $Cu_3Sn$ layer ([thickness of the $Cu_3Sn$ layer]/[total thickness of the intermetallic compound layer]) can be between 0.3-1, more preferred to be between 0.5-1, and even more preferred to be between 0.71-1. When the solder completely transforms into $Cu_3Sn$ intermetallic compound layer, physical characterization measurement for electrical resistance, stress, Younge's coefficient, and others, reveal that they show excellent properties including low electrical resistance and high mechanical strength.

Further, the intermetallic compound layer can further comprise a $Cu_6Sn_5$ layer, or further comprise a $Cu_6Sn_5$ layer having orientation-less atomic arrangement. The $Cu_3Sn$ layer can be disposed between the nano-twinned copper layer and the $Cu_6Sn_5$ layer, and the thickness ratio between the intermetallic compound layer and the $Cu_6Sn_5$ layer ([$Cu_3Sn$ layer thickness]/[intermetallic compound layer thickness]) can be between 0.3-1, which is preferred to be 0.5-1, more preferred to be between 0.71-1.

In the electrical connecting structure having nano-twinned copper for the present invention, after a long period of time of heat treatment under certain conditions, the $Cu_6Sn_5$ layer will gradually transform into the $Cu_3Sn$ layer.

In the preparation method of the electrical connecting structure having nano-twinned copper for the present invention, various kinds of solders having different components can be adopted. Therefore, the solder is preferred to be selected from the group consisting of: pure Sn, Sn/Ag/Cu solder, Sn/Ag solder, and other lead-free solders.

In the preparation method of the electrical connecting structure having nano-twinned copper for the present invention, the thickness of the nano-twinned copper layer is preferred to be 0.1 μm-500 μm, and more preferred to be 1 μm-200 μm. The diameter of the grains in the nano-twinned copper layer is preferred to be 0.1 μm-50 μm, and more preferred to be 1 μm-10 μm.

In the preparation method of the electrical connecting structure having nano-twinned copper for the present invention, 50% or more of the volume of the first nano-twinned copper layer is preferred to comprise plural grains.

In addition, the plural grains are preferred to be mutually connected, of which each grain is preferred to be formed by the stacking of plural nano-twinned copper along the [111] crystal axis direction. The geometric angle included between the stacking directions of neighboring grains is preferred to be 0 to 20 degrees.

The current invention further provides an electrical connecting element having nano-twinned. copper, which comprises: a nano-twinned copper layer; and an intermetallic compound (IMC) layer, which is disposed on one side of the nano-twinned copper layer and is connected to the nano-twinned copper layer, wherein the intermetallic compound layer comprises a $Cu_3Sn$ layer, and 50% or more of the volume of the nano-twinned copper layer comprises plural grains.

The electrical connecting element having nano-twinned copper in accordance with the present invention can be used as a connecting element for connecting chip-and-chip, chip-and-wiring board, wiring board-and-wiring board, or other electrical elements. In the current invention, the nano-twinned copper layer structure is rich of vacancy sinks, which can absorb and scatter vacancy concentration diffused to the interface due to reaction between copper and tin, which makes vacancies less possible to nucleate and precipitate. The kirkendall void existing between the nano-twinned copper layer and solder can be eliminated due to use of this material. With the current invention, element reliability and service life are increased due to lowered chance of joint (e.g. solder joint) cracking, and at the same time the high electrical conductivity and high heat dissipation of the copper are maintained. Therefore, the technology of the present invention can be applied in, for examples flip chip, ball grid array (BGA), wafer level chip scale packaging (WLCSP), and other packing techniques commonly derived from IBM C4 technique, especially those components with high frequency and high power.

In the electrical connecting element having nano-twinned copper for the present invention, the plural grains are preferred to be columnar twinned grains. In addition, the plural grains are preferred to connect with each other, each grain is formed by the stacking of plural nano-twinned copper along the [111] crystal axis direction, and the angle included between the stacking directions of the neighboring grains is 0 to 20 degrees.

In the electrical connecting element having nano-twinned copper for the present invention, the intermetallic compound layer preferably further comprises a $Cu_6Sn_5$ layer, and the $Cu_3Sn$ layer is preferred to be disposed between the nano-twinned copper layer and the $Cu_6Sn_5$ layer. After a long time period of heat treatment under particular conditions, the $Cu_6Sn_5$ layer of the intermetallic compound layer would gradually change into the $Cu_3Sn$ layer, in the electrical connecting element having nano-twinned copper.

The electrical connecting element having nano-twinned copper of the current invention is preferred to further comprise a solder layer, which is disposed on the intermetallic compound layer, to make the intermetallic compound layer be disposed between the solder layer and the nano-twinned copper layer. This is to say that, when the temperature, time, solder usage amount, and other conditions adopted during the reflow process are different, the solder would partially or entirely transform into intermetallic compound layer. Accordingly, the electrical connecting elements can have different structures.

In the electrical connecting element having nano-twinned copper of the present invention, the solder layer can be made of a material selected from the group consisting of: pure Sn solder, Sn/Ag/Cu material, Sn/Ag solder, and other lead-free solders.

The electrical connecting element having nano-twinned copper of the present invention is preferred to further comprise: a second nano-twinned copper layer, and the intermetallic compound is preferred to be disposed between the first nano-twinned copper layer and the second nano-twinned copper layer.

In an embodiment for the electrical connecting element having nano-twinned copper of the present invention, the intermetallic compound layer, for example, comprises two $Cu_3Sn$ layers and a $Cu_6Sn_5$ layer, and the $Cu_6Sn_5$ layer is disposed between the two $Cu_3Sn$ layers. Alternatively, in another embodiment, the electrical connecting element having nano-twinned copper of the present invention is preferred to further comprise a solder layer, wherein the intermetallic compound layer comprises two $Cu_3Sn$ layers and two $Cu_6Sn_5$ layers, the solder layer is disposed between the two $Cu_6Sn_5$ layers, and the two $Cu_6Sn_5$ layers and the solder layer are disposed between the two $Cu_3Sn$ layers. In yet another embodiment, the solder layer can be disposed between two $Cu_3Sn$ layers. More specifically, when two sides of the two substrates use nano-twinned copper layer, since the solder would partially or entirely transform into intermetallic compound layer after a reflow process between the nano-twinned copper layer and the solder, the intermetallic compound layer is likely to have structures including, for example, a Cu$_3$Sn layer/Cu$_6$Sn$_5$ layer/Cu$_3$Sn layer, a Cu$_3$Sn layer/Cu$_6$Sn$_5$ layer/solder/Cu$_6$Sn$_5$ layer/Cu$_3$Sn layer, or a Cu$_3$Sn layer/solder/Cu$_3$Sn layer.

In the electrical connecting element having nano-twinned copper of the present invention, the thickness of the first and/or second nano-twinned copper layer preferably is 0.1 µm-500 µm, and more preferably is 1 µm-200 µm. The grains of the first nano and/or second nano-twinned copper layer preferably have a diameter of 0.1 µm-50 µm, and more preferably 1 µm-10 µm.

The present invention further provides an electrical connecting structure having twinned-copper, comprising: a first substrate, which has a first electrical pad, wherein the first electrical pad comprises a first nano-twinned copper layer; a second substrate, which has a second electrical pad; and at least one intermetallic compound (IMC) layer, Which is disposed on a surface of the first nano-twinned copper layer and comprises a Cu$_3$Sn layer, wherein the IMC layer is disposed between the first substrate and the second substrate and is electrically connected to the first electrical pad and the second electrical pad, and 50% or more of the volume of the first nano-twinned copper layer comprises plural grains.

The electrical connecting structure having nano-twinned copper of the present invention comprises the above-mentioned electrical connecting element having nano-twinned copper. As a result of this, since the nano-twinned copper layer structure contains a rich content of vacancy sinks, which can absorb and scatter the vacancy concentration diffusing to the interface due to copper-tin reaction, to make vacancies less possible to nucleate and precipitate. The kirkendall void between the nano-twinned copper layer and the solder can get to be eliminated due to use of this material. With the current invention, element reliability and service life are increased due to lowered chance of joint (e.g. solder joint) cracking, and at the same time the high electrical conductivity and high heat dissipation of the copper are maintained.

In the electrical connecting structure having nano-twinned copper of the present invention, the plural grains are preferred to be columnar twinned grains. In addition, these grains are preferred to connect with each other, each of the grains is formed by the stacking of plural nano-twinned copper along the [111] crystal axis direction, and the angle included between the stacking directions of the neighboring grains is 0 to 20 degrees.

The electrical connecting structure having nano-twinned copper of the, present invention is preferred to comprise a solder layer, which is disposed between the intermetallic compound layer and the second electrical pad. In addition, the material for the solder layer preferably is one selected from the group consisting of: pure Sn, Sn/Ag/Cu solder, Sn/Ag solder, and other lead-free solders.

In the electrical connecting structure having nano-twinned copper of the present invention, the intermetallic compound layer is preferred to further comprise a Cu$_6$Sn$_5$ layer, preferably a Cu$_6$Sn$_5$ layer having an orientation-less atomic arrangement, wherein the Cu$_3$Sn layer is disposed between the first nano-twinned copper layer and the Cu$_6$Sn$_5$ layer. In the electrical connecting structure having nano-twinned copper of the present invention, after a long time period of heat treatment under a particular conditions, the Cu$_6$Sn$_5$ layer would gradually turn into a Cu$_3$Sn layer.

For the electrical connecting structure having nano-twinned copper of the present invention, the second electrical pad is preferred to comprise a second nano-twinned copper layer. That is, both the first electrical pad and the second electrical pad have nano-twinned copper layer. As a result, in a particular embodiment, the intermetallic compound layer can comprise two Cu$_3$Sn layers and a Cu$_6$Sn$_5$ layer, and the Cu$_6$Sn$_5$ layer is disposed between the two Cu$_3$Sn layers. In another embodiment, the intermetallic compound layer comprises two Cu$_3$Sn layers and two Cu$_6$Sn$_5$ layers, the solder layer is disposed between the two Cu$_6$Sn$_5$ layers, and the two Cu$_6$Sn$_5$ layers and the solder layer are disposed between the two Cu$_3$Sn layers. In yet another embodiment, the solder layer is disposed between the two Cu$_3$Sn layers. More specifically, the intermetallic compound layer can have the structure of Cu$_3$Sn layer/Cu$_6$Sn$_5$ layer/Cu$_3$Sn layer, Cu$_3$Sn layer/Cu$_6$Sn$_5$ layer/solder/Cu$_6$Sn$_5$ layer/Cu$_3$Sn layer, or Cu$_3$Sn layer/solder/Cu$_3$Sn layer.

In the electrical connecting structure having twinned copper of the current invention, the first substrate and/or the second substrate are preferred to be each individually selected from the group consisting of: a semiconductor chip, a circuit board, a conductive substrate (e.g. metal substrate) and a ceramic substrate.

The electrical connecting structure having nano-twinned copper of the current invention can further comprise a crystal seed layer, which is disposed between the first nano-twinned copper layer and the first electrical pad. In addition, the electrical connecting structure having nano-twinned copper of the current invention can also further comprise an adhesion layer, which is disposed between the first nano-twinned copper layer and the first electrical pad. Herein, the adhesion layer is made of a material selected from the group consisting of: titanium, titanium tungsten (TiW), titanium nitride (TiN), tantalum nitride (TaN), tantalum (Ta) and an alloy thereof.

In the electrical connecting structure having nano-twinned copper of the present invention, the thickness of the first and/or second nano-twinned copper layer is preferred to be 0.1 µm-500 µm, and more preferred to be 1 µm-200 µm. The diameter of the grains in the first nano and/or second nano-twinned copper layer is preferred to be 0.1 µm-50 µm, and more preferred to be 1 µm-10 µm.

DETAILED DESCRIPTION OF THE PREFERRED EMBODIMENT

Hereafter, examples will be provided to illustrate the embodiments of the present invention. Other various aspects also may be practiced or applied in the invention, and various modifications and variations can be made without departing from the spirit of the invention based on various concepts and applications.

Embodiment 1

Figure 2A:
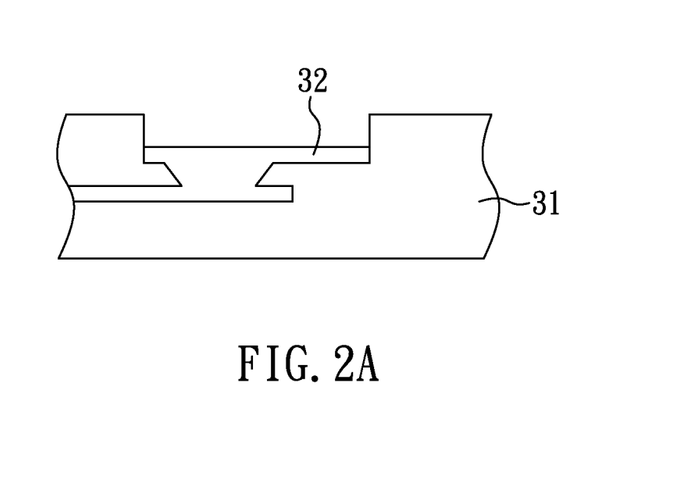
FIG. 2A to FIG. 2D are flowcharts for the preparation process of the electrical connecting element for embodiment 1 of the current invention.

FIGS. 2A to 2D show the flowcharts for the preparation of the electrical connecting element of the current embodiment. As shown in FIG. 2A, the preparation begins with providing a substrate 31, wherein the substrate 31 is a printed circuit board having a wiring layer 32 (which can also be used as an electrical pad). Next, which is shown in FIG, 2B, is to place the substrate 31 into an electroplating device 2 to be used as a cathode. The electroplating device 2 comprises an anode 22, which is immersed in the electroplating solution 24 and is connected to a direct current power supply source 26 (for which Keithley 2400 is used in this case). The material used in the anode 22 is metal copper, phosphor bronze or inert anode (e.g. platinum coated titanium). The electroplating solution 24 comprises copper sulfate (copper ion concentration being 20-60 g/L), chloride ion (whose concentration being 10-100 ppm), and methanesulfonic acid (whose concentration being 80-120 g/L), and other surfactants or lattice modification agent (e.g. BASF Lugalvan 1-100 ml/L) can also be added thereto. Optionally, the electroplating solution 24 of the current embodiment can further comprise organic acid (e.g. methanesulfonic acid), or gelatin, etc., or a combination thereof for adjusting grain structure and size.

Figure 2B:
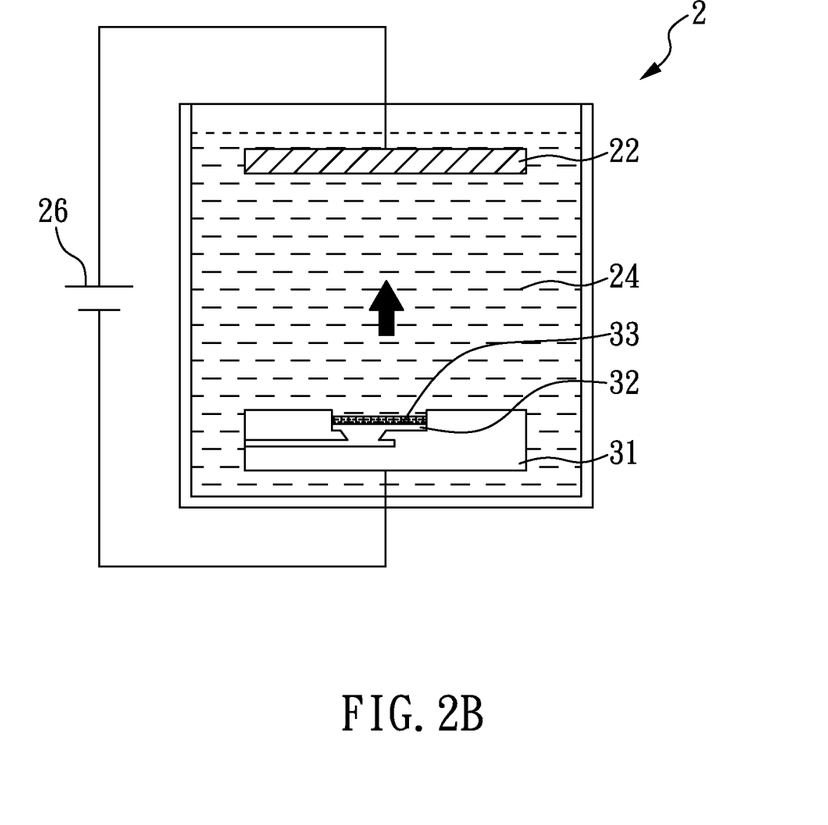

Next, an electroplating process is executed using a direct current with current density of 2-10 ASD, to grow nano-twinned copper on a surface of the wiring layer 32 on the substrate 31 in the direction pointed by the arrow (as shown in FIG. 2B). During the growth process, the (111) plane of twins and the planar surface of the nano-twinned copper metal layer are approximately perpendicular to the direction of the electric field, and Cu twins are grown at a speed of about 1.76 μm/min. The fully grown first nano-twinned copper layer 33 (used as an electrical pad) comprises a plurality of grains, and each grain is made of a plurality of Cu twins. The nano-twins stretch to the surface, so the shown surface would also be a (111) plane. The thickness of the first nano-twinned copper layer 33 obtained after electroplating is about 20 μm. The [111] crystal axis is an axis perpendicular to the (111) plane.

Figure 2C:
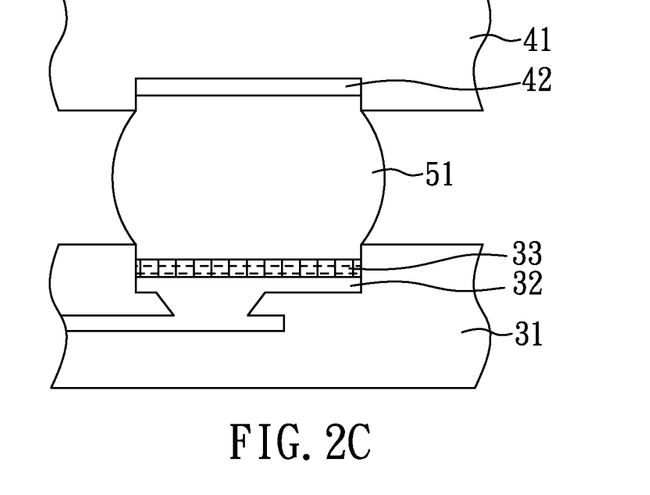

Then, as shown in FIG. 2C, a semiconductor chip 41 having an electrical pad 42 is coupled with the substrate 31 by reflow (about 180° C.) of solder 51 that binds the electrical pad 42 of the semiconductor chip 41 and the first nano-twinned copper layer 33 on the substrate 31.

Figure 2D:
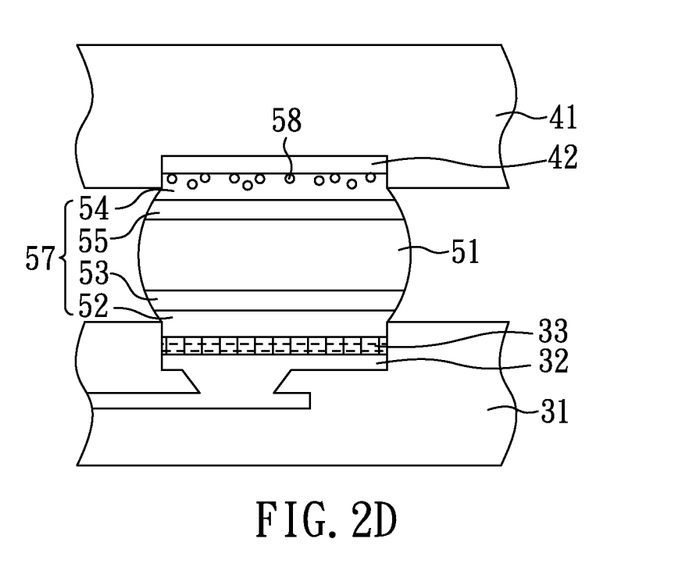

After reflow is complete, the solid-state aging process (whose operating temperature is about 180° C., the running time is about 100 hours) is carried out. Lastly, a portion of the solder 51 is transformed into intermetallic compound layer 57. The intermetallic compound layer 57 on a surface of the first nano-twinned copper layer 33 comprises a $Cu_3Sn$ layer 52 and a $Cu_6Sn_5$ layer 53; and the intermetallic compound layer 57 located on a surface of the electrical pad 42 of the semiconductor chip 41 comprises a $Cu_3Sn$ layer 54 and a $Cu_6Sn_5$ layer 55. In the current embodiment, the electrical pad 42 of the semiconductor chip 41 is not based from a nano-twinned copper layer, as a result after a thermal aging test or a long time period of power-on electrical operation, voids 58 are formed between the electrical pad 42 and the $Cu_3Sn$ layer 54. But no voids are formed between the first nano-twinned copper layer 33 and the intermetallic compound layer 57.

In the current embodiment, the running temperature for the solid-state aging is preferred to be 100° C. to 250° C. (more preferably 100° C. to 200° C.), and the running time is about 50 hours to 2000 hours. The solid-state aging temperature is determined by the melting point of the solder. Because one thing to be mindful when conducting solid-state aging is to avoid solder meltdown, the used temperature should be lower than the melting point of the solder.

In the current embodiment, the thickness of the first nano-twinned copper layer 33 is about 0.1 μm-500 μm, more preferably 0.8 μm-200 μm; here it is about 20 μm.

In the current embodiment, the substrate 31 is not restricted to a printed circuit board, and can be a semiconductor chip, an electrically conductive substrate (e.g. metal substrate), or a ceramic substrate, etc.

In the current embodiment, after a long time period of heat treatment under certain conditions, a part or a whole of the $Cu_6Sn_5$ layer 55 in the intermetallic compound layer would gradually transform into the $Cu_3Sn$ layer 54.

Embodiment 2

Figure 3A:
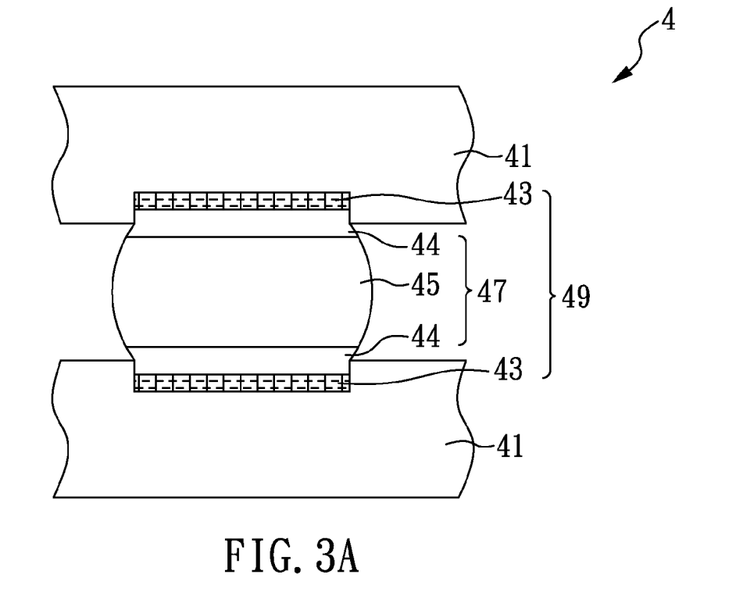
FIG. 3A is a schematic view of the electrical connecting element having twinned-copper for embodiment 2 of the current invention.

In the current embodiment, as shown in FIG. 3A, a nano-twinned copper layer 43 (used as an electrical pad) is grown on the surface of two semiconductor chips 41 by way of the same electroplating methods described for Embodiment 1.

Then, a solder is used (not shown in the Figures, the solder of the current embodiment is pure tin, thickness of which is 10 μm) to bind the two semiconductor chips 41 by reflowing at 260° C. for 0.05 hours. It is then followed by another reflow at 260° C. for 1 hour, so as to make the solder transform into an intermetallic compound layer having $Cu_3Sn$ layers 44 and a $Cu_6Sn_5$ layer 45 with direction-less atomic ordering. Herein, the $Cu_3Sn$ layer 44 has a thickness of 1 μm, and the thickness of the $Cu_6Sn_5$ layer 45 is 9 μm. After reflow is complete, all solders (not shown in Figures) are transformed into intermetallic compound layer 47. As shown in FIG. 3A, the structure of the intermetallic compound layer 47 is a three-layered structure comprising $Cu_3Sn$ layer 44/$Cu_6Sn_5$ layer 45/$Cu_3Sn$ layer 44.

Figure 3B:
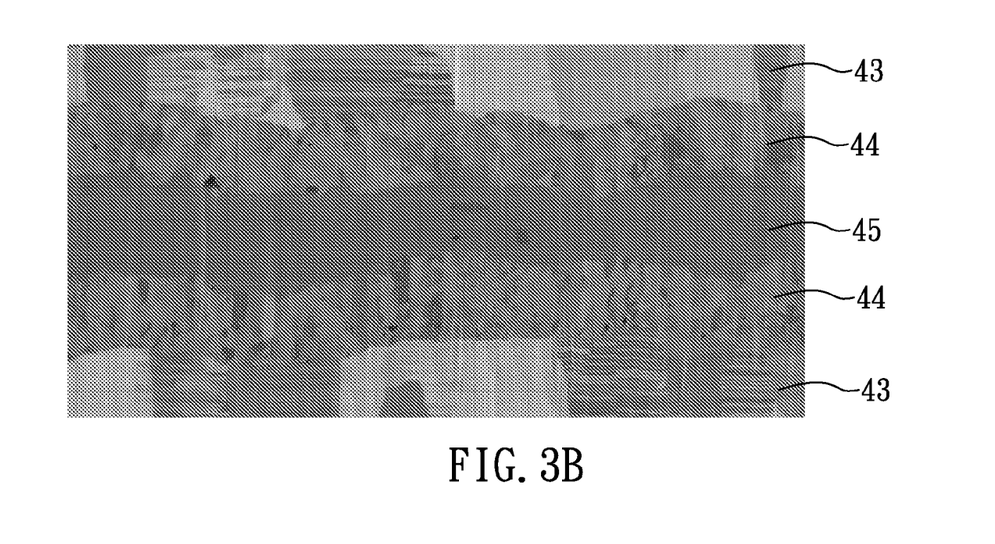
FIG. 3B is a cross-sectional focused ion beam (FIB) image of the electrical connecting element for embodiment 2 of the current invention.
Figure 3C:
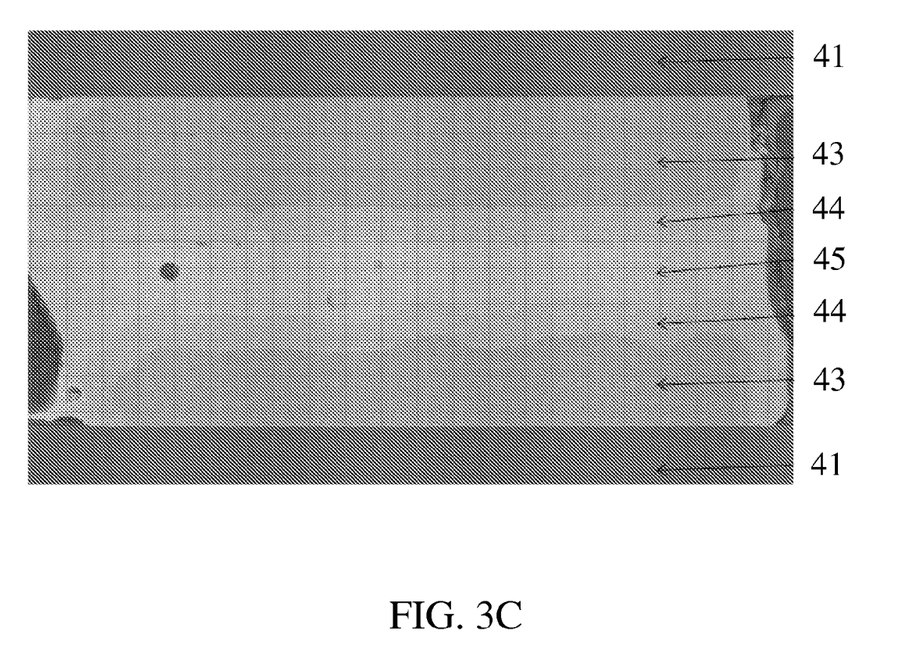
FIG. 3C is a cross-sectional focused ion beam (FIB) image of the electrical connecting element for embodiment 2 of the current invention.

Referring now to FIG. 3B and FIG. 3C, cross-sectional focused ion beam (FIB) images of an electrical connecting element 49 for the current embodiment are shown. The electrical connecting element 49 having nano-twinned copper for the present embodiment comprises: two nano-twinned copper layers 43; and an intermetallic compound layer 47, which is disposed between two nano-twinned copper layers 43 and comprises three layers of $Cu_3Sn$ layer 44/$Cu_6Sn_5$ layer 45/$Cu_3Sn$ layer 44.

As will be understood in FIG. 3A, the electrical connecting structure 4 having nano-twinned copper of the current embodiment comprises: two semiconductor chips 41, which each has a nano-twinned copper layer 43 as an electrical pad; and an intermetallic compound layer 47, comprising a three-layers structure having $Cu_3Sn$ layer 44/$Cu_6Sn_5$ layer 45/$Cu_3Sn$ layer 44.

Embodiment 3

Figure 4A:
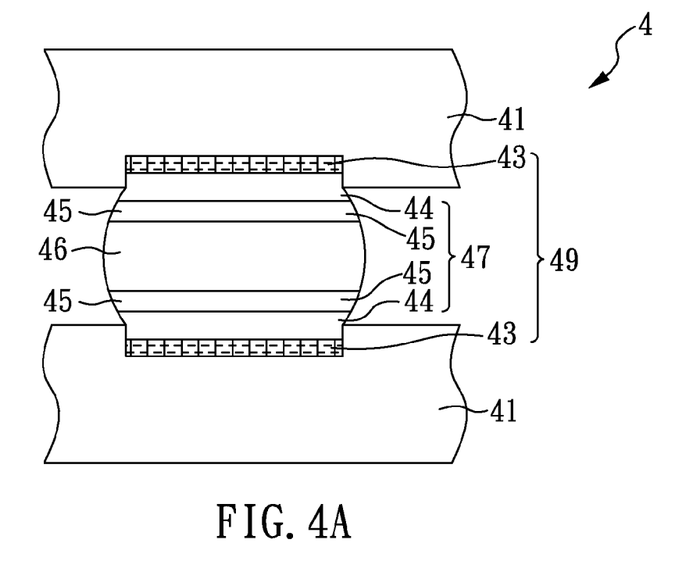
FIG. 4A shows a schematic view of the electrical connecting structure having twinned-copper for embodiment 3 of the current invention.

In reference to FIG. 4A, the electrical connecting structure 4 having nano-twined copper for the current embodiment is for the most part equivalent to the electrical connecting structure of Embodiment 2, except for the difference where the thickness of the solder 46 of the current Embodiment is larger, and only a portion of the solder 46 is transformed into the intermetallic compound layer 47 after a reflow process.

Figure 4B:
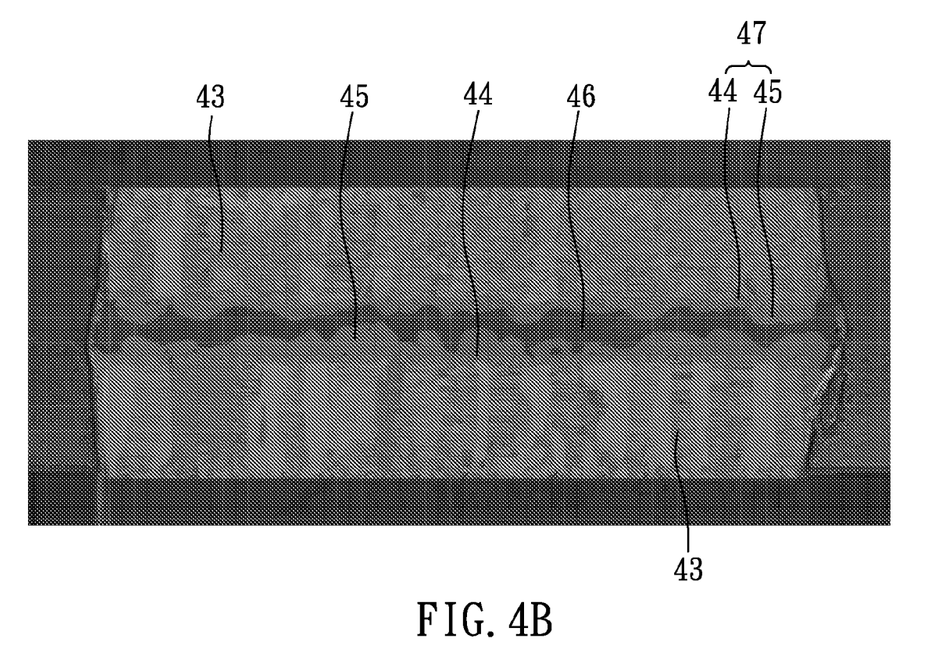
FIG. 4B shows a cross-sectional focused ion beam (FIB) image of the electrical connecting element for embodiment 3 of the current invention.

FIG. 4B shows a cross-sectional FIB image of the electrical connecting element 49 of the current embodiment. In this embodiment, the electrical connecting element having nano-twinned copper comprises (reference is also drawn to FIG. 4A): two nano-twinned copper layers 43; an intermetallic compound layer 47, which is disposed between the two nano-twinned copper layers 43 and comprises $Cu_3Sn$ layers 44 and $Cu_6Sn_5$ layers 45; a solder 46, which is disposed between two $Cu_6Sn_5$ layers 45. Therefore, the electrical connecting element 49 of the current embodiment has a structure comprising nano-twinned copper layer 43/$Cu_3Sn$ layer 44/$Cu_6Sn_5$ layer 45/solder 46/$Cu_6Sn_5$ layer 45/$Cu_3Sn$ layer 44/nano-twinned copper layer 43.

Also the electrical connecting structure 4 having nano-twinned copper of the current invention comprises: two semiconductor chips 41, each of which has a nano-twinned copper layer 43 as an electrical pad; intermetallic compound layers 47; and a solder 46.

Embodiment 4

Figure 5:
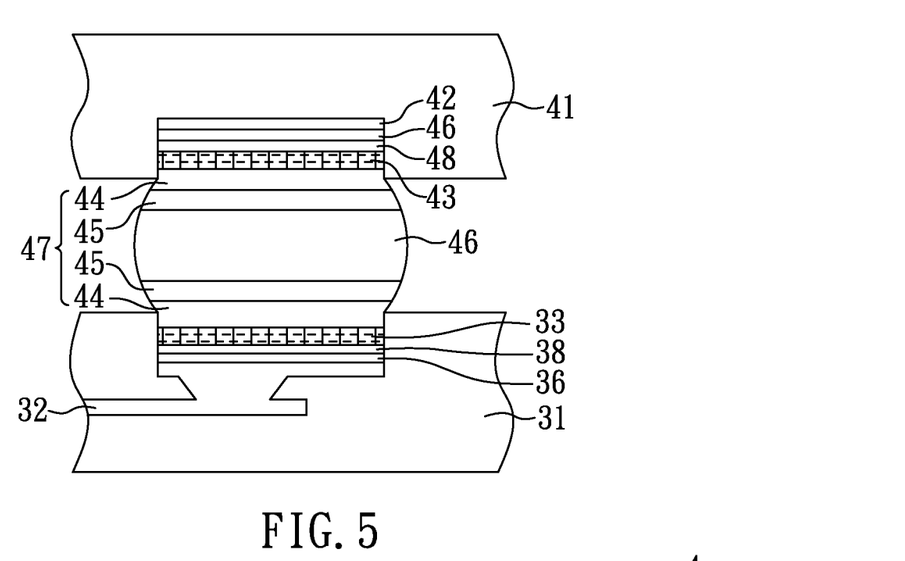
FIG. 5 shows a schematic view of the electrical connecting structure having twinned-copper for embodiment 4 of the current invention.

Referring now to FIG. 5, the current embodiment requires a substrate (a printed circuit board having a wiring layer 32) and a semiconductor chip 41 (having an electrical pad 42). An adhesion layer 46, a crystal seed layer 48, and a nano-twinned copper layer 43 are formed in a sequential order on the electrical pad 42; and another adhesion layer 36, another crystal seed layer 38, and another nano-twinned copper layer 33 are formed in a sequential order on the wiring layer 32. Solder 46 is used to bind the nano-twinned copper layer 33 on the substrate 31 and the nano-twinned copper layer 43 on the semiconductor chip 41 together in an co-corresponding manner and to perform reflow.

A portion of the solder 46 is transformed to intermetallic compound layer 47. The intermetallic compound layer 47 comprises $Cu_3Sn$ layers 44 and $Cu_6Sn_5$ layers 45.

For the current embodiment, the electrical connecting element has a stacking configuration including adhesion layer 46/crystal seed layer 48/nano-twinned copper layer 43/intermetallic compound layer 47.

Embodiment 5

Figure 6:
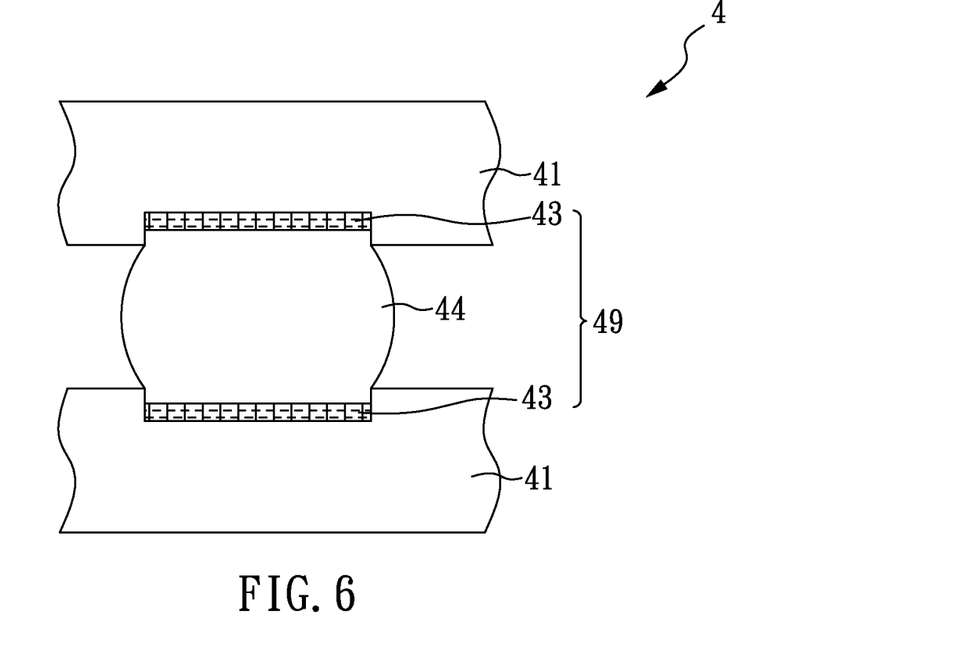
FIG. 6 shows a schematic view of the electrical connecting structure having twinned-copper for embodiment 5 of the current invention.
Figure 7:
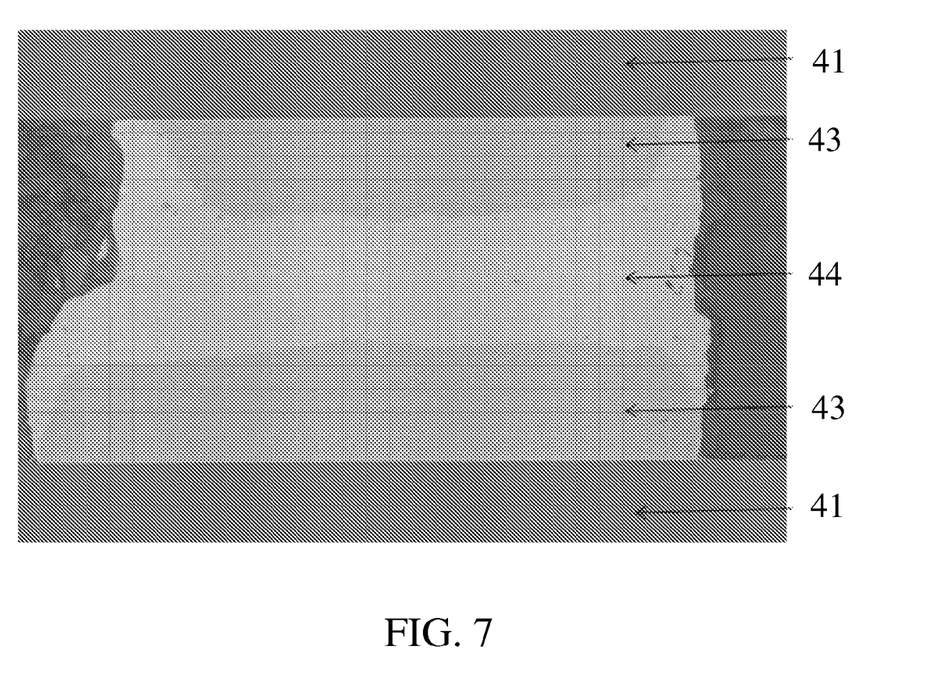
FIG. 7 is a cross-sectional focused ion beam (FIB) image of the electrical connecting element for embodiment 5 of the current invention

As shown in FIGS. 6 and 7, the current embodiment is mostly the same as that of Embodiment 2, except for a difference being the reflow and conditions of solid-state aging.

Pure tin solder is adhered on two semiconductor chips 41, and reflow process is executed at 340° C. for 1 hour (if reflow is done at 260° C., then the reflow time period requires 1 to 24 hours). During the reflow process, the solder would gradually transform into an intermetallic compound layer (including $Cu_6Sn_5$ layer and $Cu_3Sn$ layer). After reflow is done, another reflow is performed at 260° C. for 24 hours, to form an intermetallic compound layer of $Cu_3Sn$ layer 44. In the present case, thickness of $Cu_3Sn$ layer is 20 μm.

As a result, the electrical connecting structure 4 having twinned copper for the current embodiment comprises: two semiconductor chips 41, which individually has a nano-twinned copper layer 43 as an electrical pad; and an intermetallic compound layer of $Cu_3Sn$ layer 44.

What follows is measurement for electrical resistance, stress and Younge's coefficient for the electrical connecting structure 4. Through the measurement, it can be confirmed that the electrical resistance of the $Cu_3Sn$ layer 44 is 8.8 μΩcm, which is lower than 12 μΩcm of pure tin solder. This means that the $Cu_3Sn$ layer 44 of the current embodiment can enhance the electrical connection between the two semiconductor chips 41, and can reduce power consumption. Also, the hardness and the Younge's coefficient of the $Cu_3Sn$ layer 44 are respectively measured to be 5.72 MPa/m and 108.3 GPa, which is higher than the 50 GPa of pure tin solder. Therefore this shows that the $Cu_3Sn$ layer 44 of the current embodiment is capable of effectively resisting damage caused by electromigration, and has higher mechanical property. Furthermore, because the melting point of the $Cu_3Sn$ layer 44 is 675° C., it can withstand high temperature and solid state meltdown.

It would be seen from the above measurement results that the $Cu_3Sn$ layer 44 of the intermetallic compound layer has lower electrical resistance and higher mechanical strength.

Embodiment 6

Figure 8:
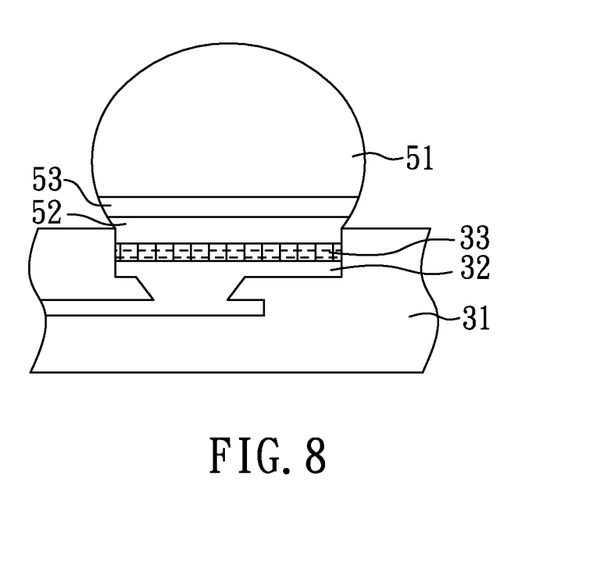
FIG. 8 shows a schematic view of the electrical connecting structure having twinned-copper for embodiment 6 of the current invention.

As shown in FIG. 8, the present embodiment first requires a substrate 31 (printed circuit board having a wiring layer 32). Next, as shown by the same method and conditions as used in Embodiment 1, nano-twinned copper is grown on a surface of the wiring layer 32 to form a first nano-twinned copper layer 33. Next, a solder 51 is coupled to the surface of the first nano-twinned copper layer 33, to prepare the electrical connecting structure having nano-twinned copper of the current embodiment.

Figure 9A:
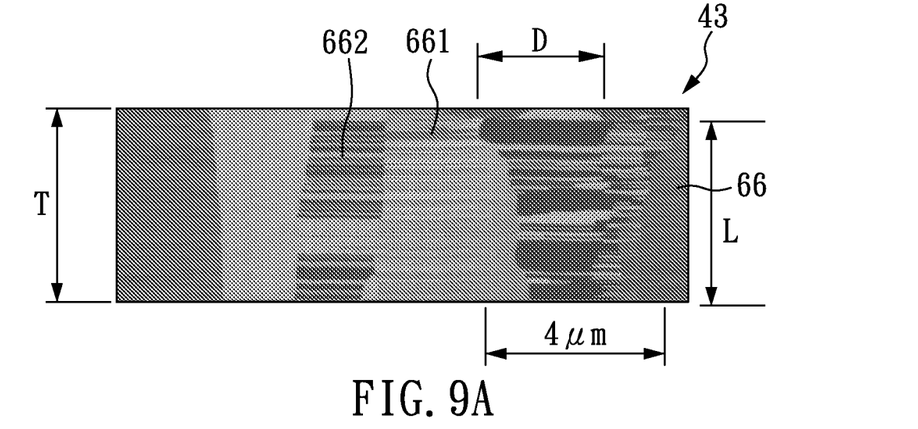
FIG. 9A is a cross-sectional focused ion beam (FIB) image for the nano-twinned copper layer 43 of preferred embodiment according to the present invention.
Figure 9B:
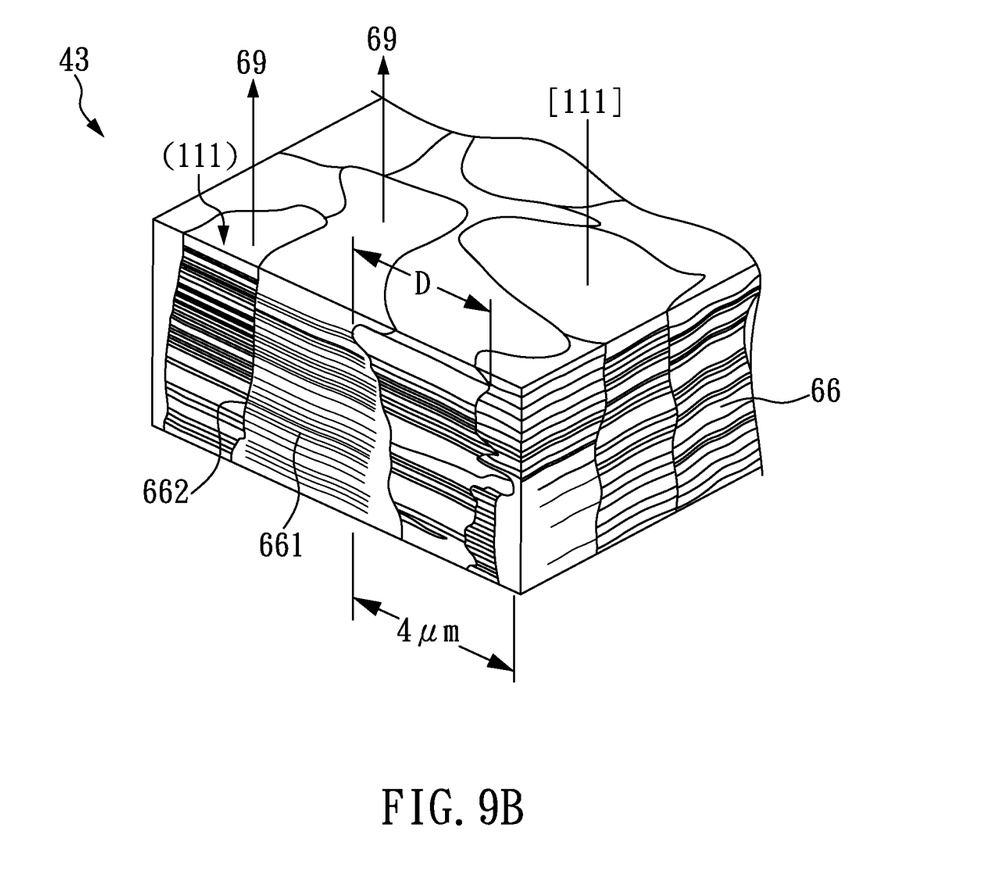
FIG. 9B shows a three-dimensional view of the nano-twinned copper layer 43 of preferred embodiment according to the present invention.

FIG. 9A shows a cross-sectional FIB image of the nano-twinned copper layer 43 of the above Embodiment, and FIG. 9B is a three-dimensional view of the nano-twinned copper layer 43. Over 50% of the volume of the nano-twinned copper layer 34 has a plurality of columnar grains 66, and each grain has a plurality of nano-twinned copper layers (for example, a pair of black line and white line neighboring to each other making up a twinned copper, which grow by staking in a stacking direction 69 to form a grain 66). In the current invention, the entire nano-twinned copper layer 43 comprises a considerable amount of nano-twinned copper. The diameter D of these columnar grains 66 ranges about 0.5 μm to 8 μm, and the height L is about 2 μm to 20 μm. The plane 611 (horizontal stripes) of the nano twins is parallel to the (111) plane, and grain boundaries 622 are present between twin grains. In addition, the Cu (111) plane is perpendicular to the thickness T direction, and the thickness T of the twinned copper layer 43 is about 20 μm (which is freely adjustable between 0.1 μm-500 μm). An angle included between stacking directions of the neighboring grains (which is almost equivalent to [111] crystal axis) is within 0 degree to 20 degrees.

In summary, the preparation for the electrical connecting element having nano-twinned copper, the electrical connecting element having twinned copper, and the electrical connecting structure having twinned copper according to the present invention are characterized in forming the specific material of nano-twinned copper on the substrate (for example, semiconductor chip or circuit substrate) as an electrical connecting medium. The nano-twinned copper layer can help in reducing the production of kirkendall voids between the nano-twinned copper layer and solder after a reflow process, even after a long-term operation. More specifically, the nano-twinned copper layer of the present invention can eliminate the lattice vacancies diffused between solder and intermetallic compound, and thus can reduce the production of voids between the nano-twinned copper layer and the intermetallic compound layer. Accordingly, the cracking issue of joints (for example solder joints) can be resolved, and the reliability and service life of elements can be enhanced. As a result, the technology of the present invention can be applied in, for example, flip chip, ball grid array (BGA), wafer level chip scale packaging (WLCSP), and all kinds of packaging technologies.

The above embodiments are for the purpose of better describing the current invention and are of exemplary nature only. The scope of right asserted by the current invention is based on the scope of claims in this application, and is not intended to be restricted by the above embodiments.

What is claimed is:

1. An electrical connecting element having nano-twinned copper, comprising:
    a first nano-twinned copper layer; and
    an intermetallic compound layer, which is disposed on one side of the first nano-twinned copper layer, is connected to the first nano-twinned copper layer, and comprises a $Cu_3Sn$ layer;
    wherein 50% or more of a volume of the first nano-twinned copper layer comprises plural grains.

2. The electrical connecting element having nano-twinned copper of claim 1, wherein the intermetallic compound layer comprises the $Cu_3Sn$ layer and a $Cu_6Sn_5$ layer, and the $Cu_3Sn$ layer is disposed between the first nano-twinned copper layer and the $Cu_6Sn_5$ layer.

3. The electrical connecting element having nano-twinned copper of claim 1, further comprising a solder layer disposed on the intermetallic compound layer, wherein the intermetallic compound is disposed between the solder layer and the first nano-twinned copper layer.

4. The electrical connecting element having nano-twinned copper of claim 3, wherein the solder layer is made of a material selected from the group consisting of: pure Sn, Sn/Ag/Cu solder, Sn/Ag solder and other lead-free solders.

5. The electrical connecting element having nano-twinned copper of claim 1, further comprising a second nano-twinned copper layer, wherein the intermetallic compound is disposed between the first nano-twinned copper layer and the second nano-twinned copper layer.

6. The electrical connecting element having nano-twinned copper of claim 5, wherein the intermetallic compound layer comprises two $Cu_3Sn$ layers and a $Cu_6Sn_5$ layer, and the $Cu_6Sn_5$ layer is disposed between the two $Cu_3Sn$ layers.

7. The electrical connecting element having nano-twinned copper of claim 6, further comprising a solder layer, wherein the intermetallic compound layer comprises two $Cu_3Sn$ layers and two $Cu_6Sn_5$ layers, the solder layer is disposed between the two $Cu_6Sn_5$ layers, and the two $Cu_6Sn_5$ layers and the solder layer are disposed between the two $Cu_3Sn$ layers.

8. An electrical connecting structure having twinned copper, comprising:
    a first substrate, which has a first electrical pad, wherein the first electrical pad comprises a first nano-twinned copper layer;
    a second substrate, which has a second electrical pad; and
    at least one intermetallic compound (IMC) layer, which is disposed on a surface of the first nano-twinned copper layer and between the first substrate and the second substrate, is electrically connected to the first electrical pad and the second electrical pad, and comprises a $Cu_3Sn$ layer;
    wherein 50% or more of a volume of the first nano-twinned copper comprises a plurality of grains.

9. The electrical connecting structure having twinned copper of claim 8, wherein, the plurality of grains are columnar twinned grains and are connected to each other, each of the grains is formed by a stacking of a plurality of nano-twinned copper along a [111] crystal axis direction, and an angle included between stacking directions of neighboring grains is in a range of 0 degree to 20 degrees.

10. The electrical connecting structure having twinned copper of claim 8, further comprising a solder layer, which is disposed between the intermetallic compound layer and the second electrical pad.

11. The electrical connecting structure having twinned copper of claim 10, wherein the solder layer is made of a material selected from the group consisting of: pure Sn, Sn/Ag/Cu solder, Sn/Ag solder, and other lead-free solders.

12. The electrical connecting structure having twinned copper of claim 8, wherein the intermetallic compound layer comprises the $Cu_3Sn$ layer and a $Cu_6Sn_5$ layer, and the $Cu_3Sn$ layer is disposed between the first nano-twinned copper layer and the $Cu_6Sn_5$ layer.

13. The electrical connecting structure having twinned copper of claim 8, wherein the second electrical pad comprises a second nano-twinned copper layer.

14. The electrical connecting structure having twinned copper of claim 13, wherein the intermetallic compound layer comprises two $Cu_3Sn$ layers and a $Cu_6Sn_5$ layer, and the $Cu_6Sn_5$ layer is disposed between the two $Cu_3Sn$ layers.

15. The electrical connecting structure having twinned copper of claim 8, further comprising a crystal seed layer, which is disposed between the first nano-twinned copper layer and the first electrical pad.

16. A method for preparing an electrical connecting structure having twinned copper, comprising the steps of:
    (A) providing a first substrate;
    (B) forming a nano-twinned copper layer on a portion of a surface of the first substrate;
    (C) disposing a solder on a surface of the nano-twinned copper layer; and
    (D) performing reflow at a temperature range from 100° C. to 800° C. to connect the solder and the nano-twinned copper layer to form an electrical connecting element, wherein the solder at least partially transforms to an intermetallic compound (IMC) layer, and the intermetallic compound layer comprises a $Cu_3Sn$ layer.

17. The method of claim 16, further comprising a step (E) after the step (D): performing solid-state aging to the electrical connecting element at a temperature range from 100° C. to 800° C.

18. The method of claim 16, further comprising a step (D0) before the step (D): connecting the second substrate and the first substrate.

19. The method of claim 16, further comprising a step (D1) after the step (D): using the solder to connect a second substrate and the first substrate, and performing another reflow.

20. The method of claim 16, wherein the nano-twinned copper layer in the step (B) is formed by a method selected from the group consisting of:
 direct current electroplating, pulse electroplating, physical vapor deposition, chemical vapor deposition, and copper foil etching.

21. The method of claim 16, wherein the firs substrate comprises a first electrical pad, and the electrical pad comprises the nano-twinned copper layer.

22. The method of claim 16, wherein after the reflow of the step (D) is complete, the solder is entirely transformed into the intermetallic compound layer.

23. The method of claim 16, wherein the intermetallic compound layer further comprises a $Cu_6Sn_5$ layer or a $Cu_6Sn_5$ layer having an orientation-less atomic ordering.

24. The method of claim 16, wherein the nano-twinned copper layer has a thickness of 0.1 μm-500 μm.

\* \* \* \* \*